United States Patent
Hshieh

(10) Patent No.: US 7,199,006 B2
(45) Date of Patent: Apr. 3, 2007

(54) PLANARIZATION METHOD OF MANUFACTURING A SUPERJUNCTION DEVICE

(75) Inventor: Fwu-Iuan Hshieh, Saratoga, CA (US)

(73) Assignee: Third Dimension (3D) Semiconductor, Inc., Tempe, AZ (US)

( * ) Notice: Subject to any disclaimer, the term of this patent is extended or adjusted under 35 U.S.C. 154(b) by 306 days.

(21) Appl. No.: 11/009,616

(22) Filed: Dec. 10, 2004

(65) Prior Publication Data

US 2005/0176192 A1    Aug. 11, 2005

Related U.S. Application Data

(60) Provisional application No. 60/531,467, filed on Dec. 19, 2003.

(51) Int. Cl.
  *H01L 21/336* (2006.01)
  *H01L 23/58* (2006.01)

(52) U.S. Cl. ............... 438/248; 438/389; 438/561; 438/700; 257/E21.551

(58) Field of Classification Search ........... 438/386, 438/268, 248, 197, 260, 389, 561, 700; 257/510, 257/330, 335, 493, 77
See application file for complete search history.

(56) References Cited

U.S. PATENT DOCUMENTS

| | | |
|---|---|---|
| 4,158,206 A | 6/1979 | Neilson |
| 4,895,810 A | 1/1990 | Meyer et al. |
| 5,019,522 A | 5/1991 | Meyer et al. |
| 5,045,903 A | 9/1991 | Meyer et al. |
| 5,216,275 A | 6/1993 | Chen |
| 5,366,914 A | 11/1994 | Takahashi et al. |
| 5,435,888 A | 7/1995 | Kalnitsky et al. |
| 5,472,888 A | 12/1995 | Kinzer |
| 5,506,421 A * | 4/1996 | Palmour ............... 257/77 |
| 5,598,018 A | 1/1997 | Lidow et al. |
| 5,742,087 A | 4/1998 | Lidow et al. |
| 5,744,994 A | 4/1998 | Williams |
| 5,786,619 A | 7/1998 | Kinzer |
| 5,902,127 A | 5/1999 | Park |
| 5,929,690 A | 7/1999 | Williams |
| 5,939,754 A | 8/1999 | Hoshi |
| 6,081,009 A | 6/2000 | Neilson |
| 6,136,652 A * | 10/2000 | Hazani ............... 438/260 |
| 6,184,555 B1 | 2/2001 | Tihanyi et al. |
| 6,190,970 B1 | 2/2001 | Liao et al. |

(Continued)

*Primary Examiner*—Michelle Estrada
*Assistant Examiner*—Nicholas J. Tobergte
(74) *Attorney, Agent, or Firm*—Akin Gump Strauss Hauer & Feld, LLP

(57) ABSTRACT

A method of manufacturing a semiconductor device includes providing a substrate having first and second main surfaces. The substrate has a heavily doped region of a first conductivity at the second main surface and has a lightly doped region of the first conductivity at the first main surface. The method includes providing trenches and mesas in the substrate, implanting, at an angle, a dopant of the first conductivity into a sidewall of a mesa and implanting, at an angle, a dopant of a second conductivity into the mesa at another sidewall. The method includes oxidizing the sidewalls and bottoms of each trench and tops of the mesas to create a top oxide layer, etching back the top oxide layer to expose a portion of the mesa, depositing an oxide layer to cover the etched back top layer and mesa and planarizing the top surface of the device.

20 Claims, 6 Drawing Sheets

U.S. PATENT DOCUMENTS

| | | | |
|---|---|---|---|
| 6,198,127 B1 | 3/2001 | Kocon | |
| 6,214,698 B1 | 4/2001 | Liaw et al. | |
| 6,222,229 B1 | 4/2001 | Herbert et al. | |
| 6,239,463 B1 | 5/2001 | Williams et al. | |
| 6,265,281 B1 | 7/2001 | Reinberg | |
| 6,291,856 B1 | 9/2001 | Miyasaka et al. | |
| 6,300,171 B1 | 10/2001 | Frisina | |
| 6,307,246 B1 * | 10/2001 | Nitta et al. | 257/493 |
| 6,359,309 B1 | 3/2002 | Liao et al. | |
| 6,362,505 B1 | 3/2002 | Tihanyi | |
| 6,391,723 B1 | 5/2002 | Frisina | |
| 6,410,958 B1 | 6/2002 | Usi et al. | |
| 6,452,230 B1 | 9/2002 | Boden, Jr. | |
| 6,459,124 B1 | 10/2002 | Tihanyi | |
| 6,465,325 B2 | 10/2002 | Ridley et al. | |
| 6,495,421 B2 | 12/2002 | Luo | |
| 6,501,130 B2 | 12/2002 | Disney | |
| 6,501,146 B1 | 12/2002 | Harada | |
| 6,504,230 B2 | 1/2003 | Deboy et al. | |
| 6,509,220 B2 | 1/2003 | Disney | |
| 6,635,906 B1 | 10/2003 | Chen | |
| 6,710,403 B2 * | 3/2004 | Sapp | 257/330 |
| 7,023,069 B2 * | 4/2006 | Blanchard | 257/510 |
| 7,041,560 B2 * | 5/2006 | Hshieh | 438/268 |
| 2002/0070418 A1 | 6/2002 | Kinzer et al. | |
| 2002/0149051 A1 * | 10/2002 | Kinzer et al. | 257/335 |
| 2005/0176192 A1 * | 8/2005 | Hshieh | 438/197 |
| 2005/0181558 A1 * | 8/2005 | Hshieh | 438/248 |
| 2005/0181577 A1 * | 8/2005 | Hshieh | 438/427 |
| 2006/0160309 A1 * | 7/2006 | Hshieh | 438/268 |
| 2006/0252219 A1 * | 11/2006 | Hshieh | 438/386 |

* cited by examiner

PLANARIZATION METHOD OF MANUFACTURING A SUPERJUNCTION DEVICE

CROSS-REFERENCE TO RELATED APPLICATIONS

This application claims priority to U.S. Provisional Patent Application No. 60/531,467, filed Dec. 19, 2003, entitled "Planarization Method of Manufacturing a Superjunction Device."

BACKGROUND OF THE INVENTION

The present invention relates to a method for manufacturing a semiconductor device having an edge termination structure that includes a thick oxide region and particularly to a semiconductor device which is metal-oxide semiconductor (MOS)-gated, and that is suitable for power switching, having both a low on-resistance and a high breakdown voltage. More particularly, the present invention is directed to planarization methods of manufacturing superjunction semiconductor devices.

Since the invention of superjunction devices by Dr. Xingbi Chen, as disclosed in U.S. Pat. No. 5,216,275, there have been many attempts to expand and improve on the superjunction effect of his invention. U.S. Pat. Nos. 6,410,958, 6,300,171 and 6,307,246 are examples of such efforts and are incorporated herein by reference.

U.S. Pat. No. 6,410,958 ("Usui, et al.") relates to an edge termination structure and a drift region for a semiconductor component. A semiconductor body of the one conductivity type has an edge area with a plurality of regions of the other conductivity type embedded in at least two mutually different planes. Underneath the active zone of the semiconductor component, the drift regions are connected using the underlying substrate.

U.S. Pat. No. 6,307,246 ("Nitta, et al.") discloses a semiconductor component having a high-voltage sustaining edge structure in which a multiplicity of parallel-connected individual components are disposed in a multiplicity of cells of a cell array. In an edge region, the semiconductor component has cells with shaded source zone regions. During commutation of the power semiconductor component, the shaded source zone regions suppress the switching "on" of a parasitic bipolar transistor caused by the disproportionately large reverse flow current density. Moreover, an edge structure having shaded source zone regions can be produced very easily in technological terms that are discussed in the Nitta, et al. patent. It clarifies the effects of parameters and enables the mass production of a superjunction semiconductor device which has a drift layer composed of a parallel PN layer that conducts electricity in the "on" state and is depleted in the "off" state. The net quantity of active impurities in the N-type drift regions is within the range of 100% to 150% of the net quantity of active impurities in the P-type partition regions. In addition, the width of either one of the N-type drift regions and the P-type partition regions is within the range between 94% and 106% of the width of the other regions.

U.S. Pat. No. 6,300,171 ("Frisina") discloses a method for manufacturing an edge structure for a high voltage semiconductor device, including a first step of forming a first semiconductor layer of a first conductivity type, a second step of forming a first mask over the top surface of the first semiconductor layer, a third step of removing portions of the first mask in order to form at least one opening in it, a fourth step of introducing dopant of a second conductivity type in the first semiconductor layer through the at least one opening, a fifth step of completely removing the first mask and of forming a second semiconductor layer of the first conductivity type over the first semiconductor layer, a sixth step of diffusing the dopant implanted in the first semiconductor layer in order to form a doped region of the second conductivity type in the first and second semiconductor layers. The second step up to the sixth step are repeated at least one time in order to form a final edge structure including a number of superimposed semiconductor layers of the first conductivity type and at least two columns of doped regions of the second conductivity type, the columns being inserted in the number of superimposed semiconductor layers and formed by superimposition of the doped regions subsequently implanted through the mask openings, the column near the high voltage semiconductor device being deeper than the column farther from the high voltage semiconductor device.

It is desirable to provide an edge termination region that is manufactured using a technique that is compatible with a process that uses only a single epitaxial deposition step to manufacture the device.

BRIEF SUMMARY OF THE INVENTION

Briefly stated, the present invention comprises a method of manufacturing a semiconductor device that includes providing a semiconductor substrate having first and second main surfaces opposite to each other. The semiconductor substrate has a heavily doped region of a first conductivity type at the second main surface and has a lightly doped region of the first conductivity type at the first main surface. The method includes providing in the semiconductor substrate a plurality of trenches and a plurality of mesas. Each of the plurality of trenches has a first extending portion extending from the first main surface toward the heavily doped region to a first depth position, and each of the plurality of trenches is disposed between adjacent mesas. Each of the plurality of trenches has an approximate equal width relative to the other trenches. Each of the plurality of mesas has sidewall surfaces with a predetermined inclination maintained relative to the first main surface. The method also includes implanting, at a first predetermined angle of implant, a dopant of the first conductivity type into a preselected mesa region of the semiconductor substrate at a sidewall surface of one mesa so as to form at the sidewall surface of the one mesa a first doped region of the first conductivity type having a doping concentration lower than that of the heavily doped region. The method also includes implanting, at a second predetermined angle of implant, a dopant of the second conductivity type into the preselected mesa region at a sidewall surface opposite to the sidewall implanted with the dopant of the first conductivity type, to provide a second doped region of the second conductivity type at the sidewall surface opposite to the sidewall implanted with the dopant of the first conductivity type and to provide a P-N junction of the first and second doped regions located along the depth direction of the plurality of trenches. The method further includes oxidizing the sidewalls and bottoms of each trench and the tops of the plurality of mesas to create a top oxide layer, etching back the top oxide layer to expose a preselected portion of the preselected mesa, depositing an oxide layer using a process selected from a group that includes tetraethylorthosilicate (TEOS)

and spun-on-glass (SOG) oxide deposition to cover the etched back top layer and preselected mesa and planarizing the top surface of the device.

The present invention also comprises a method of manufacturing a semiconductor device that includes providing a semiconductor substrate having first and second main surfaces opposite to each other. The semiconductor substrate has a heavily doped region of a first conductivity type at the second main surface and has a lightly doped region of the first conductivity type at the first main surface. The method also includes providing in the semiconductor substrate a plurality of trenches and a plurality of mesa regions. Each of the plurality of mesa regions has a first extending portion extending from the first main surface toward the heavily doped region to a first depth position and has a sidewall surface with a predetermined inclination maintained relative to the first main surface. Each of the plurality of trenches has an approximate equal width relative to the other trenches. Each of the plurality of mesa regions is surrounded by one of the plurality of trenches. The method also includes implanting, at a first predetermined angle of implant, a dopant of the first conductivity type into a preselected group of mesa regions of the plurality of mesa regions at a sidewall surface in one of the plurality of trenches to form at the sidewall surface of each of the preselected group of mesa regions a first doped region of the first conductivity type having a doping concentration lower than that of the heavily doped region. The method also includes implanting, at a second predetermined angle of implant, a dopant of a second conductivity type into the preselected group of mesa regions at a sidewall surface opposite to the sidewall implanted with the dopant of the first conductivity type to provide a second doped region of the second conductivity type at the sidewall surface opposite to the sidewall implanted with the dopant of the first conductivity type and to provide a P-N junction of the first and second doped regions located along the depth direction of the plurality of trenches. The method further includes oxidizing the bottom of each trench and sidewalls and the tops of the plurality of mesas to create a top oxide layer, etching back the top oxide layer to expose a preselected portion of the preselected group of mesa regions, depositing an oxide layer using a process selected from a group that includes tetraethylorthosilicate (TEOS) and spun-on-glass (SOG) oxide deposition to cover the etched back top layer and preselected mesa and planarizing the top surface of the device.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
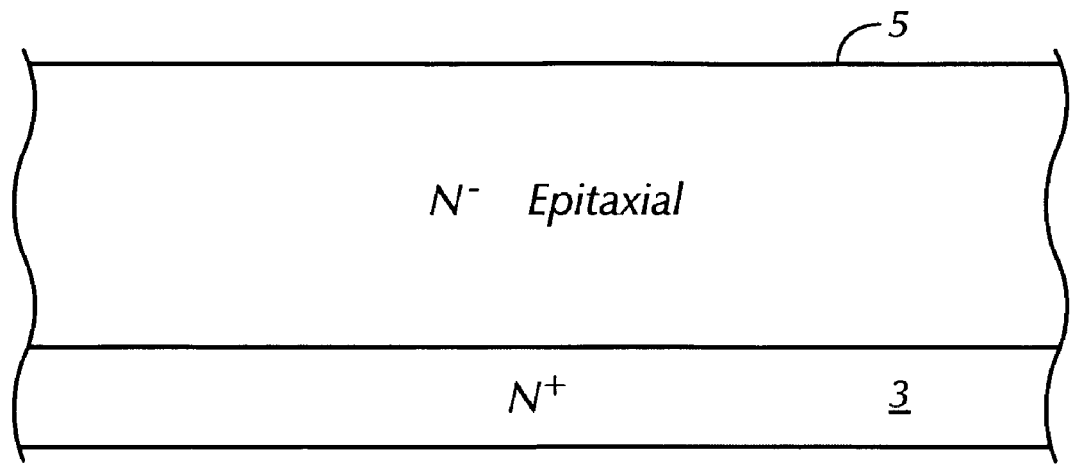
FIG. 1 is a partial sectional elevational view of a semiconductor wafer.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a", as used in the claims and in the corresponding portions of the specification, means "at least one."

Referring to FIG. 1, there is shown a partial view of a semiconductor wafer that includes an $N^+$ substrate 3 and an $N^-$ epitaxial layer 5. As used herein, reference to conductivity will be limited to the embodiment described. However, those skilled in the art know that P-type conductivity can be switched with N-type conductivity and the device would still be functionally correct (i.e., using a first or a second conductivity type). Therefore, where used herein, the reference to N or P can also mean that either N and P or P and N can be substituted.

Figure 2:
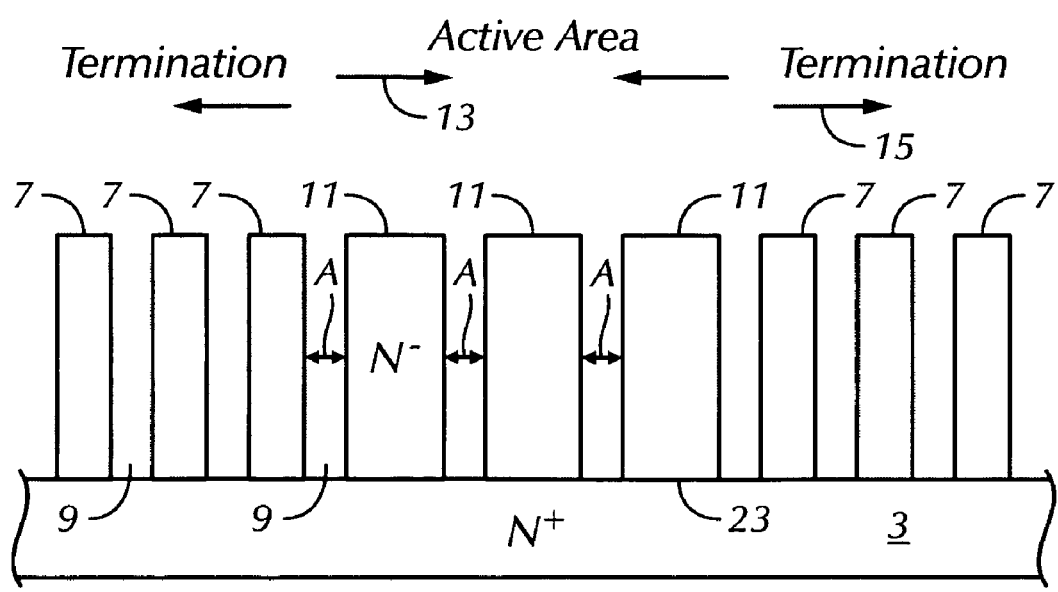
FIG. 2 is a partial sectional elevational view of the semiconductor wafer after an etch step.

Referring to FIG. 2, using techniques known in the art, the epitaxial layer 5 is etched so that the trench bottom touches or approaches the interface between the substrate 3 and the epitaxial layer 5. The etch process creates trenches 9, first mesas 7 and second mesas 11. The first mesas 7 are referred to as "sacrificial mesas" because the first mesas 7 will be converted to silicon dioxide during the process steps described herein. The second mesas 11 are referred to as "device mesas" because the second mesas 11 are used to form the voltage sustaining layer for each transistor cell manufactured by the process. As indicated by arrows 15, the mesas 7 are located in what is called the "termination region" or the "edge termination region," and by arrows 13 the mesas 11 are located in the "active area."

Figure 3:
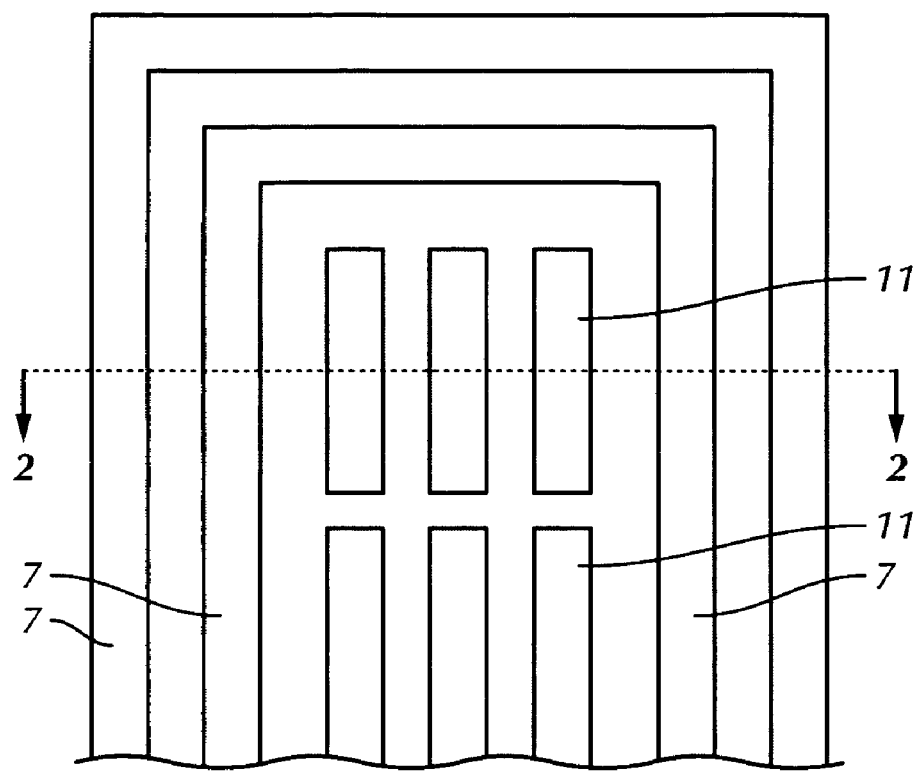
FIG. 3 is a partial top plan view of the semiconductor wafer of FIG. 2.

FIG. 3 shows a top plan view of FIG. 2, where a plurality of device mesas 11 and the sacrificial mesas 7 are shown. It should be observed that the mesas 11 are wider than the mesas 7. This difference in width is necessary because during the oxidation process only a portion of the mesas 11 will be converted to silicon dioxide while the sacrificial mesas 7 will be completely converted to silicon dioxide. However, the width A (FIG. 2) of the trenches 9 adjacent to mesas 7 and 11 are about the same relative to the other trenches 9. Though not shown clearly, the trenches 9 are preferably wider at their tops by 1%–10% than at their bottoms to facilitate the trench fill process. Thus, the mesas 7 and 11 have sidewall surfaces with a predetermined inclination maintained relative to the first main surface of the epitaxial layer 5. The trenches 9 extend from the first main surface of the epitaxial layer 5 toward the substrate (heavily doped region) 3 to a first depth position by depth D, but not necessarily all the way to the substrate (heavily doped region) 3.

Figure 4:
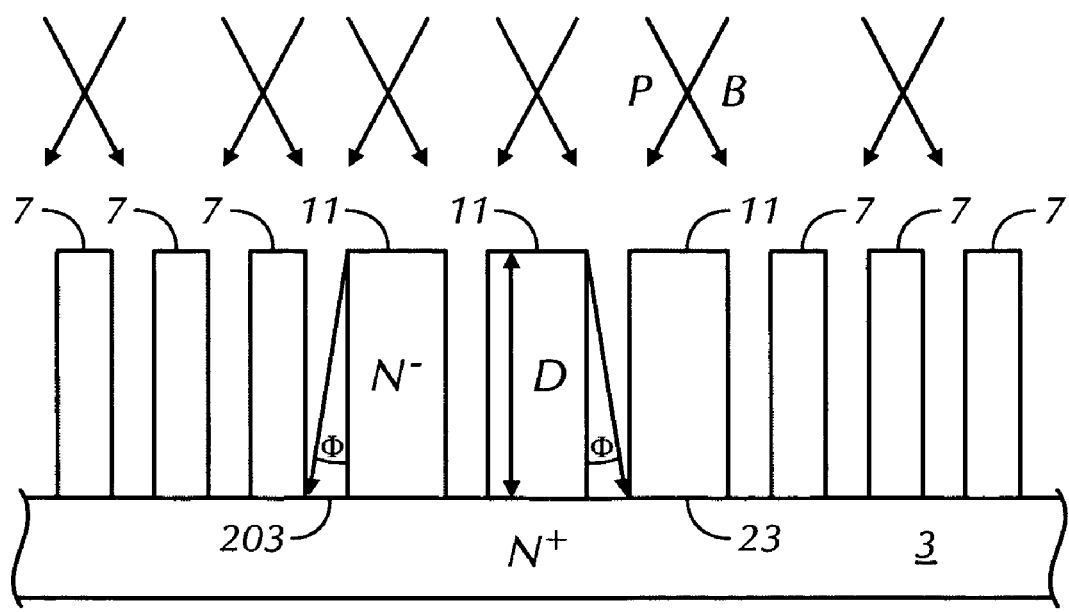
FIG. 4 is a partial sectional elevational view of the semiconductor wafer of FIG. 2 having an ion implant step being performed.

Proceeding to FIG. 4, at a slighted angel Φ (i.e., an angle of implant Φ), without benefits of a masking step, both the mesas 11 and 7 will be implanted by boron (B) on one side and phosphorous (P) on the opposite side, as is indicated by the implant arrows P and B, respectively. The angle of implant Φ can be between about 2° and 12° with the best results at about 4°. However, the respective angles of implant Φ for boron (i.e., a dopant having a second conductivity) and for phosphorus (i.e., a dopant having a first conductivity) is determined by the width A (FIG. 2) and the depth D of the trenches 9. The implanting of the boron may be at a first predetermined angle of implant Φ and the implanting of the phosphorous may be at a second predetermined angle of implant Φ different than the first predetermined angle of implant Φ, but the angle of implant Φ may also be the same for both the boron and the phosphorous.

Figure 5:
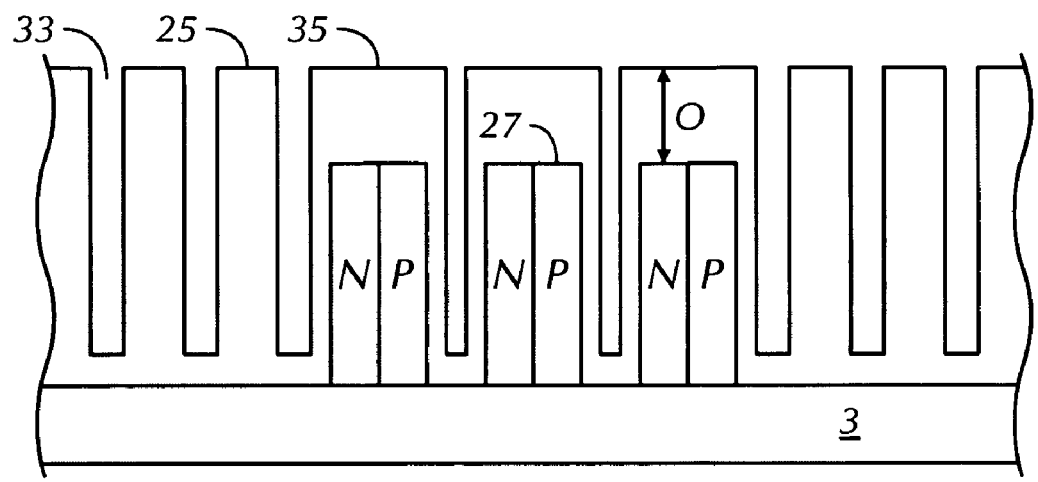
FIG. 5 is a partial sectional elevational view of the semiconductor wafer of FIG. 4 after an oxidation step.
Figure 6:
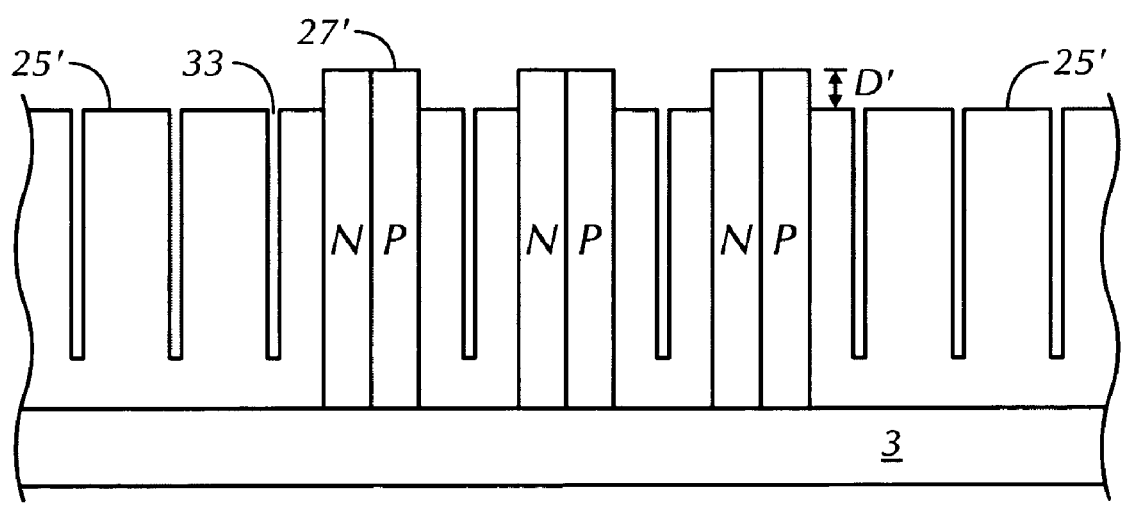
FIG. 6 is a partial sectional elevational view of the semiconductor wafer of FIG. 5 after an dry etch back step.

Referring to FIG. 5, following the drive in of the implants, a steam oxidation step is performed in which the mesas 7 are converted to silicon dioxide pillars 25 because of their narrower width and the mesas 11 are converted to N/P pillars 27 that are surrounded by the silicon dioxide. It is part of the invention to leave small gaps 33 (FIG. 6) between each oxide mesa pillar 27. The gaps 33 will be covered and isolated so as not to create difficulty within the manufacturing process. This structure is shown in FIG. 6. A dry etch is then performed to etch back the oxide layer 35 that covers the N/P pillars 27. The thickness of the oxide layer 35, is represented by the letter O which is typically about 0.5–3.0 micrometers or microns (μm).

Referring to FIG. 6, because the etch rate for the N/P regions 27 is less than that of the silicon dioxide pillars 25', the N and P columns of the pillars 27' are exposed and represented by the dimension lines D' which is typically about 0.6–3.2 μm.

Figure 7:
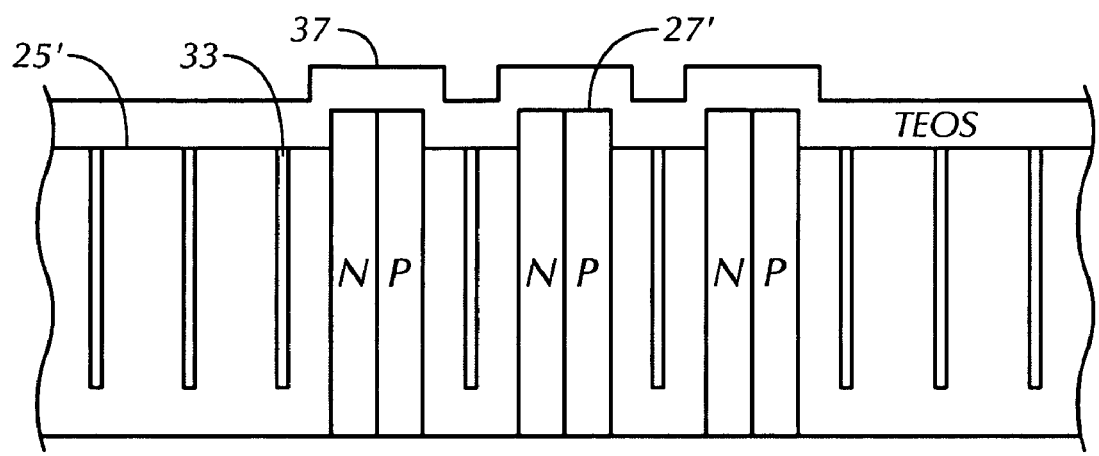
FIG. 7 is a partial sectional elevational view of the semiconductor wafer of FIG. 6 after a tetraethylorthosilicate (TEOS) deposition step.

In FIG. 7, the oxide layer is replaced using a technique known as "TEOS oxide deposition" which is a form of chemical vapor deposition (CVD) and refers to the chemical tetraethylorthosilicate (TEOS) that is used to provide a covering oxide layer 37 that covers the openings 33 between the pillars 25' and 27'.

Figure 8:
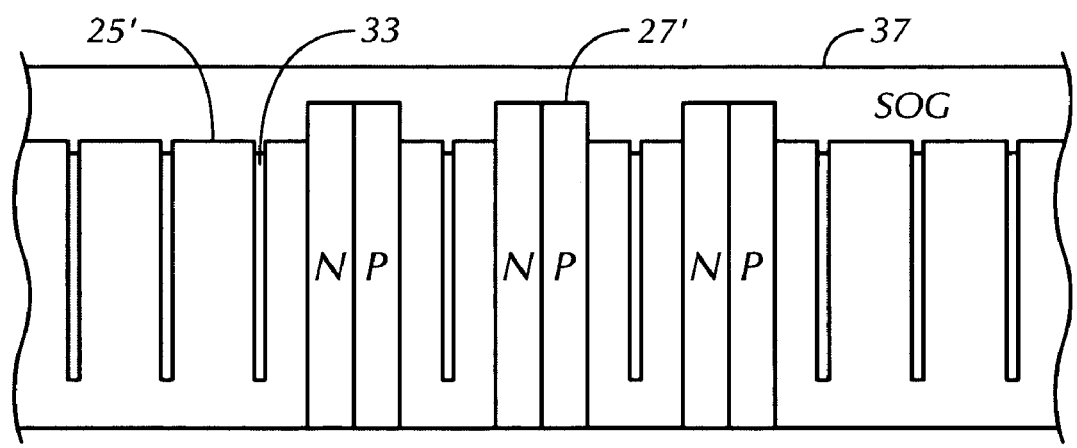
FIG. 8 is a partial sectional elevational view of the semiconductor wafer of FIG. 7 after a spun-on-glass (SOG) deposition step.

FIG. 8 provides an alternate embodiment where the oxide layer 37 could be spun-on-glass (SOG) as shown, in which the openings 33 are covered and the oxide pillars 25' are covered with the SOG as are the N/P columns 27'.

Figure 9:
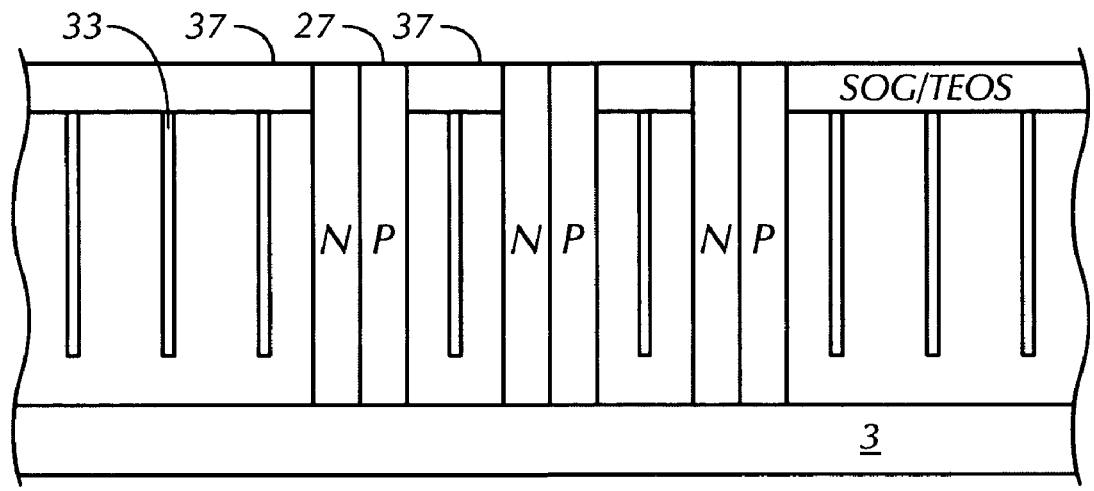
FIG. 9 is a partial sectional elevational view of the semiconductor wafer of FIG. 6 or 7 after a chemical mechanical polishing (CMP) step.

After planarization using chemical mechanical polishing (CMP), FIG. 9 shows the oxide layer 37 leaving the tops of the N/P columns 27' exposed in order to create the device features for the transistor. The amount of planarization is D' or is about 0.6–3.2 μm. Next, the gate dielectric layer is formed, and the gate conductor is deposited and masked to form the gate(s).

Figure 10:
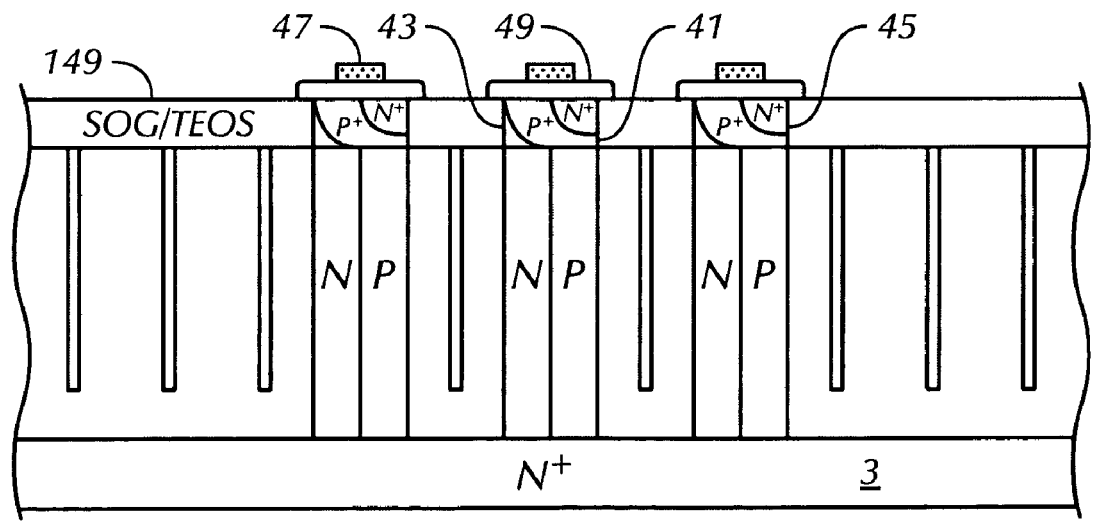
FIG. 10 is a partial sectional elevational view of the semiconductor wafer of FIG. 9 after the completion of the final steps.

In FIG. 10, the device of FIG. 9 is masked and a $P^+$ implant is performed followed by a drive step. Next, using well known masking techniques, if needed, an $N^+$ source region is implanted and driven in. This sequence is shown in FIG. 10 where there is a $P^+$ region 41 in which the $N^+$ source region 45 is implanted, and there is a gate oxide region 49 covering the device in which a gate terminal 47 is positioned in the gate oxide layer covering the N region 43, the $P^+$ region 41, and the $N^+$ source region 45.

Figure 11:
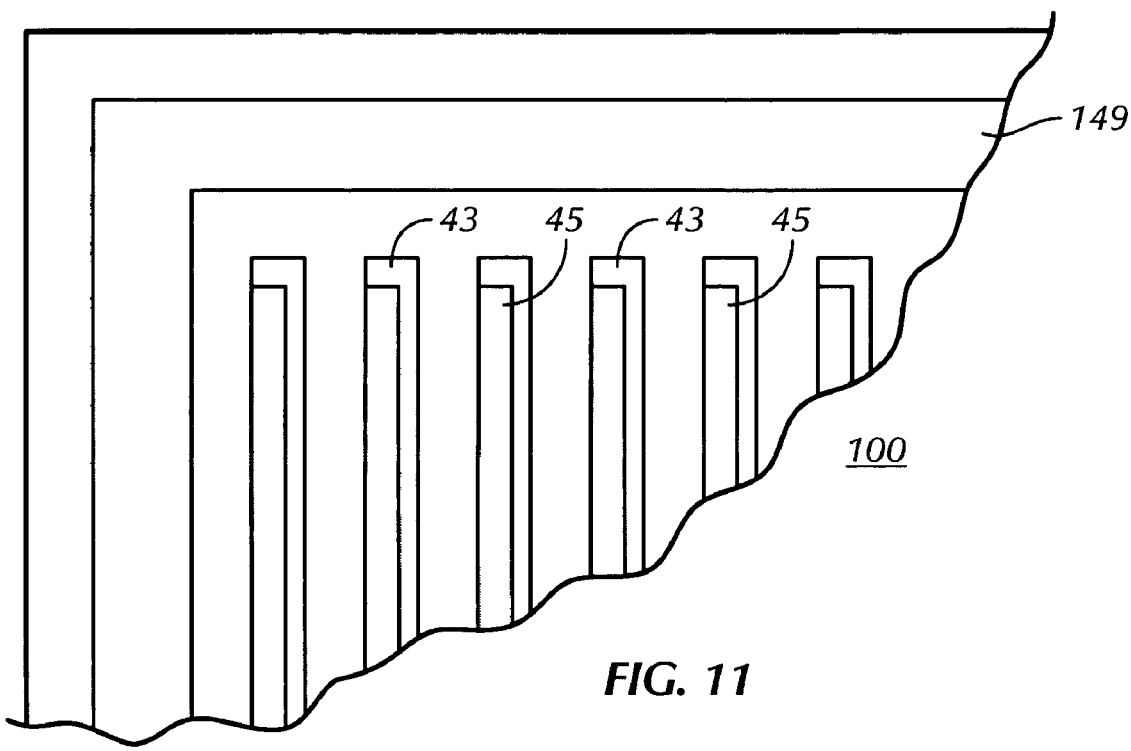
FIG. 11 is a partial top plan view of the semiconductor wafer of FIG. 10.

Although any of the known geometries may be used to manufacture the device of FIG. 10, FIG. 11 shows a partial top plan view of a device 100 manufactured in a stripe design having an edge termination region 149 according to the invention.

Figure 12:
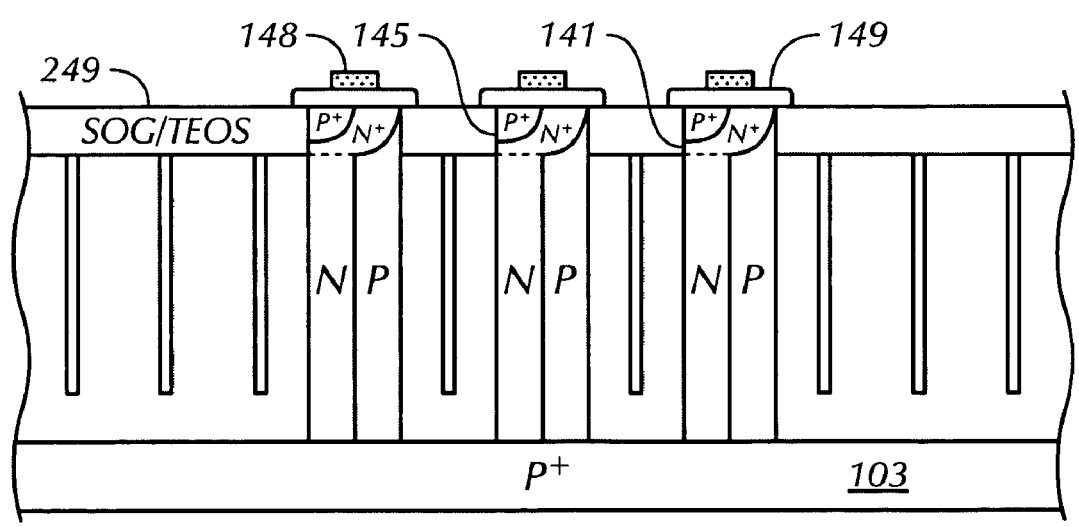
FIG. 12 is a partial sectional elevational view of an alternative embodiment of the embodiment of FIG. 9.

As shown in FIG. 12, the device of FIG. 9 can be manufactured starting with a $P^+$ substrate 103 and a P type epitaxial layer. Using the alternate embodiment a masked step is performed and an $N^+$ implant can be performed followed by a drive step after which a $P^+$ drain region may be implanted and driven in. The resulting structure is shown in FIG. 12 where there is an $N^+$ region 141 in which the $P^+$ source region 145 is implanted, and there is a gate oxide region 149 covering the device in which a gate terminal 148 is positioned above the gate oxide layer 149 covering the $P^+$ region 145, and the $N^+$ body 141 prior to contact formation, metallization and passivation. The edge termination structure of this device is region 249. Thus, additional implants can also be provided such as by providing a third doped region of the second conductivity type at the first main surface of the first and second doped regions which are electrically connected to the second doped region and by providing a fourth doped region of the first conductivity type at at least one of the first main surface or a sidewall surface of the one trench 9 such that the fourth doped region is opposite to the first doped region with the third doped region posed therebetween. The gate electrode layer 148 is provided opposite to the third doped region between the first and fourth doped regions, with a gate insulation layer 149 interposed therebetween.

From the foregoing, it can be seen that the present invention is directed to a semiconductor device and planarization methods for manufacturing a semiconductor device. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method of manufacturing a semiconductor device comprising:

providing a semiconductor substrate having first and second main surfaces opposite to each other, the semiconductor substrate having a heavily doped region of a first conductivity type at the second main surface and having a lightly doped region of the first conductivity type at the first main surface;

forming in the semiconductor substrate a plurality of trenches and a plurality of mesas, each of the plurality of trenches having a first extending portion extending from the first main surface toward the heavily doped region to a first depth position, each of the plurality of trenches being disposed between adjacent mesas, each of the plurality of mesas having sidewall surfaces;

implanting a dopant of the first conductivity type into a preselected mesa region of the semiconductor substrate at a sidewall surface of one mesa so as to form at the sidewall surface of the at least one mesa a first doped region of the first conductivity type having a doping concentration lower than that of the heavily doped region;

implanting a dopant of the second conductivity type into the preselected mesa region at a sidewall surface opposite to the sidewall implanted with the dopant of the first conductivity type, to provide a second doped region of the second conductivity type at the sidewall surface opposite to the sidewall implanted with the dopant of the first conductivity type;

oxidizing the sidewalls and bottoms of at least the trenches adjacent to the preselected mesa region and the top of the preselected mesa region to create a top oxide layer;

etching back the top oxide layer to expose a preselected portion of the preselected mesa;

depositing an oxide layer using a process selected from a group that includes tetraethylorthosilicate (TEOS) and spun-on-glass (SOG) oxide deposition to cover the etched back top layer and preselected mesa; and planarizing the top surface of the device.

2. The method according to claim 1, further comprising:
providing a third doped region of the second conductivity type at the first main surface of the first and second doped regions to be electrically connected to the second doped region;

providing a fourth doped region of the first conductivity type at at least one of the first main surface and a sidewall surface of the one trench such that the fourth doped region is opposite to the first doped region with the third doped region posed therebetween; and providing a gate electrode layer opposite to the third doped region between the first and fourth doped regions, with a gate insulation layer interposed therebetween.

3. The method according to claim 2, wherein the gate electrode layer is formed on the first main surface.

4. The method according to claim 1, further comprising:
providing a third doped region of the second conductivity type at the first main surface of the first and second doped regions to be electrically connected to the second doped region.

5. The method according to claim 1, wherein a diffusion length of each of the dopants of the fast and second conductivity types in manufacturing the semiconductor device is longer than a distance from the sidewall surfaces of the adjacent pair of trenches to the P-N junction of the first and second doped regions.

6. A method of manufacturing a semiconductor device comprising:
providing a semiconductor substrate having first and second main surfaces opposite to each other, the semiconductor substrate having a heavily doped region of a first conductivity type at the second main surface and having a lightly doped region of the first conductivity type at the first main surface;

forming in the semiconductor substrate a plurality of trenches and a plurality of mesa regions, each of the plurality of mesa regions having a first extending portion extending from the first main surface toward the heavily doped region to a first depth position and having a sidewall surface, each of the plurality of mesa regions being surrounded by one of the plurality of trenches;

implanting a dopant of the first conductivity type into a preselected group of mesa regions of the plurality of mesa regions at a sidewall surface in one of the plurality of trenches to form at the sidewall surface of each of the preselected group of mesa regions a first doped region of the first conductivity type having a doping concentration lower than that of the heavily doped region;

implanting a dopant of a second conductivity type into the preselected group of mesa regions at a sidewall surface opposite to the sidewall implanted with the dopant of the first conductivity type to provide a second doped region of the second conductivity type at the sidewall surface opposite to the sidewall implanted with the dopant of the first conductivity type;

oxidizing at least the bottom of each of the trenches adjacent to the preselected group of mesa regions and sidewalls and the tops of the preselected group of mesa regions to create a top oxide layer;

etching back the top oxide layer to expose a preselected portion of the preselected group of mesa regions;

depositing an oxide layer using a process selected from a group that includes tetraethylorthosilicate (TEOS) and spun-on-glass (SOG) oxide deposition to cover the etched back top layer and preselected mesa; and planarizing the top surface of the device.

7. The method according to claim 6, further comprising:
providing a third doped region of the second conductivity type at the first main surface of the first and second doped regions to be electrically connected to the second doped region;

providing a fourth doped region of the first conductivity type at one of the first main surface and a sidewall surface of the one trench such that the fourth doped region is opposite to the first doped region with the third doped region posed therebetween; and providing a gate electrode layer opposite to the third doped region between the first and fourth doped regions, with a gate insulation layer interposed therebetween.

8. The method according to claim 6, wherein the gate electrode layer is formed on the first main surface.

9. The method according to claim 6, further comprising:
providing a third doped region of the second conductivity type at the first main surface of the first and second doped regions to be electrically connected to the second doped region.

10. The method according to claim 6, further comprising:
providing an electrode layer in ohmic contact with the first doped region.

11. The method according to claim 6, wherein a diffusion length of each of the dopants of the fast and second conductivity types in manufacturing the semiconductor device is longer than a distance from the sidewall surfaces of the adjacent pair of trenches to a P-N junction of the first and second doped regions.

12. The method according to claim 1, wherein each of the plurality of trenches has an approximate equal width relative to the other trenches.

13. The method according to claim 1, wherein each of the sidewall surfaces has a predetermined inclination angle maintained relative to the first main surface.

14. The method according to claim 1, wherein the implanting of the dopant of the first conductivity type is performed at a first predetermined angle of implant.

15. The method according to claim 1, wherein the implanting of the dopant of the second conductivity type is performed at a second predetermined angle of implant.

16. The method according to claim 6, wherein each of the plurality of trenches has an approximate equal width relative to the other trenches.

17. The method according to claim 6, wherein each of the sidewall surfaces has a predetermined inclination angle maintained relative to the first main surface.

18. The method according to claim 6, wherein the implanting of the dopant of the first conductivity type is performed at a first predetermined angle of implant.

19. The method according to claim 6, wherein the implanting of the dopant of the second conductivity type is performed at a second predetermined angle of implant.

20. A semiconductor device comprising:
a semiconductor substrate having first and second main surfaces opposite to each other, the semiconductor substrate having a heavily doped region of a first conductivity type at the second main surface and having a lightly doped region of the first conductivity type at the first main surface,
the first main surface including a plurality of trenches and a plurality of mesas, each of the plurality of trenches having a first extending portion extending from the first main surface toward the heavily doped region to a first depth position, each of the plurality of trenches being disposed between adjacent mesas, each of the plurality of mesas having sidewall surfaces;
a first doped region of the first conductivity type having a doping concentration lower than that of the heavily doped region formed at a sidewall surface of at least one mesa;
a second doped region of the second conductivity type formed at a sidewall surface opposite to the sidewall surface having the first doped region;
a top oxide layer formed on the sidewalls and bottoms of at least the trenches adjacent to the preselected mesa region and the top of the preselected mesa region; and
a second oxide layer formed using a process selected from a group that includes tetraethylorthosilicate (TEOS) and spun-on-glass (SOG) oxide deposition that covers at least an etched back portion of the top layer and the preselected mesa region.

* * * * *